US009445522B2

(12) United States Patent
Um

(10) Patent No.: US 9,445,522 B2
(45) Date of Patent: Sep. 13, 2016

(54) STRUCTURALLY-EMBEDDED CONSTRUCTION, DESIGN, AND MAINTENANCE RECORD DATA MANAGEMENT SYSTEM AND RELATED METHOD

(71) Applicant: Taeho Um, Fremont, CA (US)

(72) Inventor: Taeho Um, Fremont, CA (US)

( * ) Notice: Subject to any disclaimer, the term of this patent is extended or adjusted under 35 U.S.C. 154(b) by 553 days.

(21) Appl. No.: 13/886,279

(22) Filed: May 3, 2013

(65) Prior Publication Data

US 2014/0330788 A1  Nov. 6, 2014

(51) Int. Cl.
*G06F 7/00* (2006.01)
*H05K 7/14* (2006.01)

(52) U.S. Cl.
CPC .................................. *H05K 7/1498* (2013.01)

(58) Field of Classification Search
None
See application file for complete search history.

(56) References Cited

U.S. PATENT DOCUMENTS

| | | | | |
|---|---|---|---|---|
| 3,738,134 A * | 6/1973 | Hall | ........................ | E05B 65/46 70/370 |
| 4,600,249 A * | 7/1986 | Anderson | ........... | E05B 73/0082 108/27 |
| 4,603,925 A * | 8/1986 | Cuevas-Cumming | . | A47B 21/00 312/196 |
| 5,005,387 A * | 4/1991 | Cufr | .................... | E05B 65/0003 70/81 |
| 5,189,606 A | 2/1993 | Burns et al. | | |
| 5,546,564 A * | 8/1996 | Horie | ..................... | G06F 17/18 434/108 |
| 5,761,674 A | 6/1998 | Ito | | |
| 7,024,660 B2 * | 4/2006 | Andrade | ............... | G06F 11/263 714/25 |
| 7,373,303 B2 | 5/2008 | Moore et al. | | |
| 2001/0044768 A1 * | 11/2001 | Wares | .................... | G06Q 10/06 705/37 |
| 2002/0029129 A1 * | 3/2002 | Satoh | ................. | G06F 17/5004 702/182 |
| 2003/0115163 A1 * | 6/2003 | Moore | ............... | G06Q 30/0283 705/500 |
| 2004/0014526 A1 * | 1/2004 | Kulas | ..................... | G06F 3/023 463/43 |
| 2005/0251687 A1 * | 11/2005 | Bachinski | .......... | G07C 9/00912 713/186 |
| 2008/0034290 A1 | 2/2008 | Woodard | | |
| 2008/0312990 A1 * | 12/2008 | Byrne | .................... | G06Q 10/00 705/7.36 |
| 2010/0052851 A1 * | 3/2010 | Kaehler | ................. | G06F 3/017 340/5.81 |
| 2010/0169139 A1 * | 7/2010 | Koenig-Richardson | ............ | G05B 15/02 700/275 |
| 2013/0251163 A1 * | 9/2013 | Adamson | ................ | H04R 3/12 381/58 |

FOREIGN PATENT DOCUMENTS

JP          2003058615 A  *  2/2003

* cited by examiner

*Primary Examiner* — Mahesh Dwivedi
*Assistant Examiner* — Hasanul Mobin
(74) *Attorney, Agent, or Firm* — Invent Capture, LLC.; Samuel S. Cho

(57) ABSTRACT

A novel structurally-embedded construction, design, and maintenance record data management system and a related method of operation provide immediate and on-the-property access to construction, design, and maintenance records that are electronically stored and updated in an electronic archive of the structurally-embedded construction, design, and maintenance record data management system. An authorized personnel who is physically on the property of a building, a bridge, a monument, or another construction structure for maintenance or improvement work, even after a natural disaster event, can readily access and update a history of construction, design, and maintenance records on-site. The extensive time, efforts, and expenses in tracking down various documents and information associated with a particular construction structure (i.e. for maintenance and renovation approvals and analysis by authorized personnel and various regulatory agencies) can be dramatically reduced, if the novel structurally-embedded construction, design, and maintenance record data management system is utilized.

15 Claims, 9 Drawing Sheets

An embodiment of data organization for a structurally-embedded construction, design, and maintenance record data management system

600

An embodiment of operative connection between an authorized personnel's mobile computing device and an electronic archive portion of a structurally-embedded construction, design, and maintenance data management system

700

An embodiment of a system diagram of a structurally-embedded construction, design, and maintenance data management system

800

STRUCTURALLY-EMBEDDED CONSTRUCTION, DESIGN, AND MAINTENANCE RECORD DATA MANAGEMENT SYSTEM AND RELATED METHOD

BACKGROUND OF THE INVENTION

The present invention generally relates to electronic and optical media-based record data management over a long period of time for construction structures. More specifically, the invention relates to one or more data management systems that are physically embedded in a construction structure for ease of data storage, update, and retrieval of construction, design, and maintenance records over the life of the construction structure for an authorized personnel. Furthermore, the invention also relates to methods of operating one or more structurally-embedded data management systems that enable reliable and long-term storage, update, and retrieval of construction, design, and maintenance records.

Construction structures, such as buildings, bridges, roads, monuments, and amusement rides in theme parks, are typically associated with a voluminous amount of construction, design, and maintenance records over the life of each construction structure. For example, in order to complete a building construction, a construction project typically requires design drawings, calculations, shop drawings, request for information documents (RFI's). After completing the construction project, if the purpose of the building is changed, the building may need to be upgraded architecturally and structurally. If an owner or a tenant of the building is changed, the building may also need some improvement in accordance with the owner's or the tenant's preferences. Furthermore, as the building ages, the building also requires maintenance. Each of these various processes over the life of the building generates a voluminous amount of construction and design data by different architects and authorized personnel in typical circumstances.

While some of these construction-related records are compiled by the architect for the purpose of regulatory approvals by local, municipal, state, and/or federal construction code enforcement agency (e.g. DSA, OSHPD, FAA, and etc.), much of the construction-related records remain scattered among various entities, and even get lost during the life of the major construction structure, which may be decades or even centuries. The scattering of various records is partially due to the fact that different architects are often involved at various functions throughout the process. Furthermore, over a long period of time, many of the private entities, such as architectural, structural engineering, and construction firms become defunct or release their responsibility to keep various construction and design records as owners or principals of the firms retire. As the major construction structure ages, various structural upgrade, renovation, and maintenance works are required to retain public safety and convenience associated with the major construction structure.

For most construction structures today that require certain structural upgrade, renovation, and maintenance works, tracking down accurate construction-related records is not an easy task. For example, if an aged building's design blueprint cannot be found readily, a structural engineer may have to resort to using a specialized X-ray scanning machine or various costly and time-consuming identification tests to scan and analyze the actual structure of the aged building before initiating any structural upgrade, renovation, and/or maintenance works on the aged building. The X-ray scanning and analysis of a construction structure is time consuming, expensive, and may only provide a limited amount of useful data in some cases.

In most cases, the social cost of X-ray scanning and various identification tests can be mostly or entirely avoided, if engineers and/or authorized personnel can readily access design records, construction-related records, and/or past maintenance records. Many municipal, state, and national governments around the world today spend exorbitant and potentially unnecessary amounts of expenses for structural identification tests. Even when a structural engineer gathers and analyzes various test data, the various test data alone may not provide sufficient understanding of an entire construction structure. Therefore, in the conventional practice of structural engineering and analysis for construction structures, structural engineers often perform their duties based on their know-how and assumption, even when a full set of desirable data and/or records are not available to them. Various analytical presumptions that a structural engineer makes frequently incur potentially unnecessary and additional cost during structural upgrade, renovation, and maintenance work.

Furthermore, after natural disaster events such as earthquakes, floods, and hurricanes, the demand for access of construction and design documents skyrocket upwards, as the needs for structural analysis and repairs of construction structures also skyrocket upwards. Unfortunately, the conventional methods of keeping construction and design records typically constrain fast and easy access to various construction and design records, when speedy and efficient repairs are needed the most after such natural disaster events.

In particular, if a natural disaster event is an earthquake, various structural damages may occur on a construction structure. In earthquake events, it is difficult to determine the impact of the earthquake on the construction structure and the extent of actual or likely damages. If the construction structure embeds seismic sensors that dynamically beacon sensory events to an electronic system embedded in the construction structure for keeping sensor records as well as construction and design records electronically, it may be very useful for assessing structural damages to the construction structure.

Therefore, it may be highly desirable to devise a highly-accessible electronic depository of construction, design, and maintenance records without requiring users to gather scattered records stored in various archives of architectural firms and municipal, state, and national governments. Furthermore, it may also be highly desirable to devise a highly-accessible electronic depository of construction, design, and maintenance records to be easily updatable by an authorized personnel after new structural upgrade, renovation, and maintenance works have been performed on a particular construction structure. In addition, it may also be desirable to devise a highly-accessible electronic depository of construction, design, and maintenance records, which is also capable of automatically archiving new event triggers from various sensors that detect earthquakes or other hazardous events for subsequent checkups by an authorized personnel. Moreover, it may also be desirable to devise a method of operating a highly-accessible electronic depository of construction, design, and maintenance records.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a structurally-embedded construction, design, and maintenance record data management system is disclosed. This system comprises: an electronic archive comprising an construction record from an initial construction period, a design record from an initial design period and the initial construction period, and a maintenance and improvement record after the initial design period and the initial construction period; an electronic archive data storage unit hosting the electronic archive with a record management program executed on a CPU and a memory unit for receiving and categorizing the construction record, the design record, and the maintenance and improvement record; and a peripheral device and external communication input and output interface unit capable of transferring one or more construction, design, and maintenance records from or to the electronic archive upon a data transfer request by an authorized personnel's mobile communication device, wherein the electronic archive data storage and the peripheral device and external input and output interface unit are physically part of a construction structure.

In another embodiment of the invention, a method for providing construction, design, and maintenance record data management from an electronic system incorporated in a construction structure is disclosed. This method comprises the steps of: structurally embedding or attaching the electronic system to be incorporated in the construction structure; initiating an operation of a record management program executed by a CPU and a memory unit of the electronic system; storing an initial batch of construction, design, and structure-related electronic records in an electronic archive of the electronic system using the record management program, wherein the electronic archive is hosted by an electronic archive data storage; if maintenance work or improvement work is performed on the construction structure, storing new maintenance and improvement data as an updated electronic record in the electronic archive of the electronic system; and if a data access request from an authorized personnel is received and authorized by the record management program, displaying or transferring requested data for the authorized personnel.

DETAILED DESCRIPTION

Figure 1:
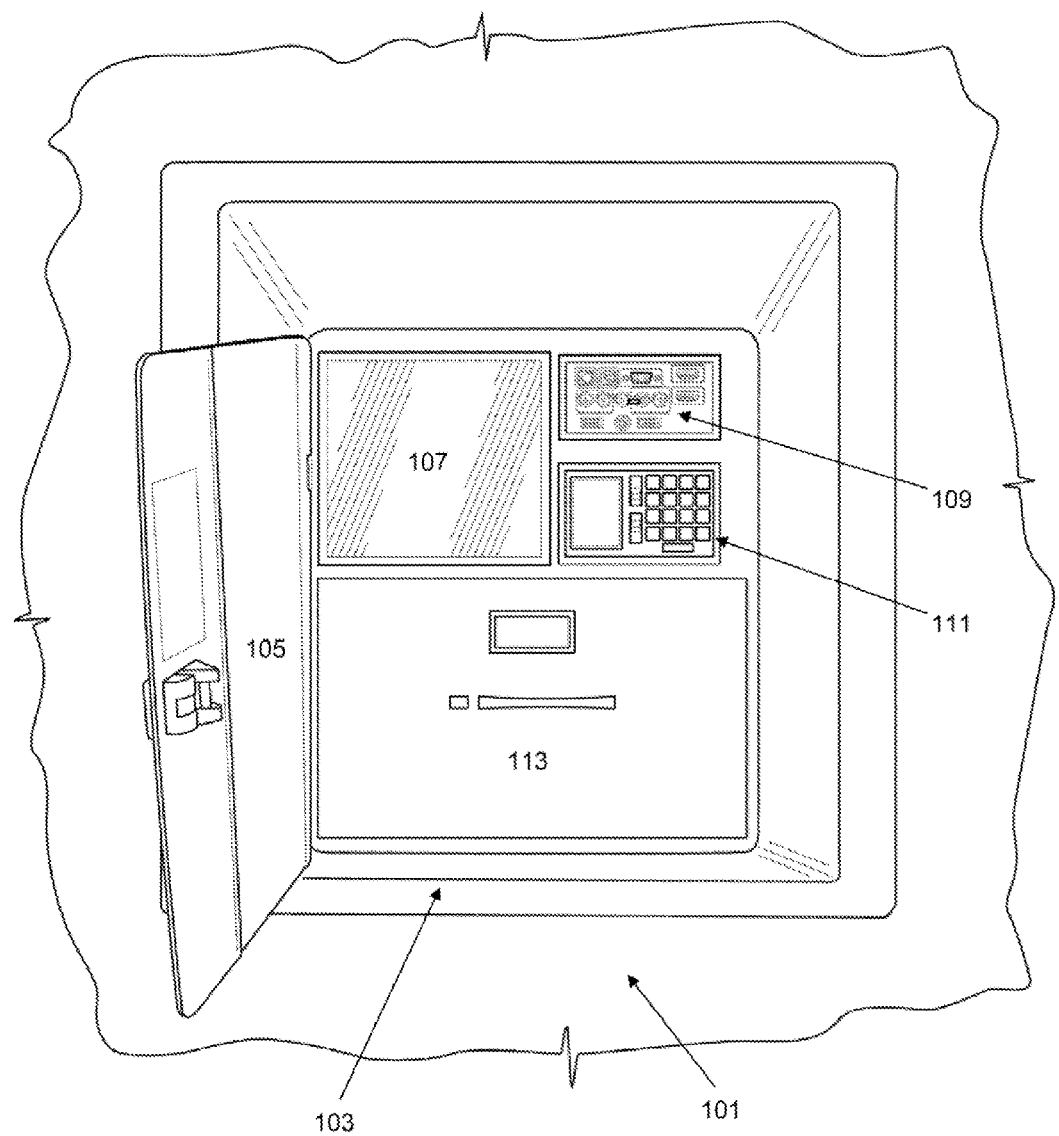
FIG. 1 shows a construction, design, and maintenance record data management system embedded in a sidewall of a building structure, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of procedures, logic blocks, processing, and/or other symbolic representations that directly or indirectly resemble one or more structurally-embedded construction, design, and maintenance data management systems and related methods of operation. These process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

For the purpose of describing the invention, a term "structurally-embedded" is defined being incorporated, integrated, and/or attached to a physical structure of a building, a bridge, a monument, a pavement, or another artificially-constructed structure. In one example, the physical structure may be a sidewall in a building, a side fence along a pavement, a maintenance tunnel underneath a bridge, a maintenance catwalk associated with a bridge, or another appropriate structure that can incorporate, integrate, and/or attach a construction, design, and maintenance record data management system.

Furthermore, for the purpose of describing the invention, a term "construction record," or "construction-related record" is defined as request-for-information (RFI) documents, construction-related drawings, inspection records, and/or any other important data issued during an actual construction of a building, a bridge, a monument, or another construction structure.

In addition, for the purpose of describing the invention, a term "design record" is defined as architectural, structural, civil, landscaping, mechanical, electrical, various calculations, various specifications, various addendums, and/or other design documents and drawings, which are typically generated during architectural, engineering, and computer-aided design (CAD) conceptualization phases before an actual construction of a building, a bridge, a monument, or another structure takes place.

Moreover, for the purpose of describing the invention, a term "maintenance record" is defined as drawings, calculations, and/or documents related to remodeling, alterations, and/or additions to an existing construction structure.

Furthermore, for the purpose of describing the invention, a term "authorized personnel" is defined as an owner, an architect, and/or an engineer who has obtained permission or authority to access a structurally-embedded construction, design, and maintenance data management system.

In addition, for the purpose of describing the invention, a term "optical media" is defined as a compact disc (CD), a digital video disc (DVD), a Blu-ray disc, or another medium of storage that uses laser or another source of light to read and access data saved on the medium of storage.

Moreover, for the purpose of describing the invention, a term "cloud," "cloud network," or "cloud computing" is defined as a data network environment in which data from an electronic system operatively connected to the data network environment is typically stored in a network-attached storage, instead of a local storage of the electronic system. In one example, the data from the electronic system may be stored in both the local storage of the electronic system as well as the network-attached storage by default. In another example, the data from the electronic system may only be stored in the network-attached storage by default without storing any data permanently in the local storage of the electronic system, other than utilizing a temporary local buffer of the electronic system.

Moreover, for the purpose of describing the invention, a term "electronic system," or "system" is defined as an electronic-circuit hardware device capable of performing certain types of intended tasks. In one embodiment of the invention, certain parts of a system, such as a central processing unit (CPU) and a memory unit, may be detachably connected to the rest of the system for performing data access, update, and management. In another embodiment of the invention, all parts of a system may be contained in a single enclosure.

In general, one or more embodiments of the invention relate to data management systems. More specifically, one or more embodiments of the invention relate to structurally-embedded construction, design, and maintenance data management systems for buildings, bridges, monuments, or other construction structures. Furthermore, some embodiments of the invention relate to methods of operating a structurally-embedded construction, design, and maintenance data management system.

In addition, one or more embodiments of the invention also relate to automatically archiving structure-related sensor records. For example, a building smoke detector, a fire (i.e. heat) sensor, a gas leak sensor, a displacement sensor (i.e. for detecting structural movements), a seismic sensor (i.e. for detecting earthquakes), and other structure-related sensors can be operatively connected to a structurally-embedded construction, design, and maintenance data management system, which automatically stores and archives sensor records in its electronic archive and/or its optical media archive for subsequent inspections by an authorized personnel.

An objective of an embodiment of the present invention is to provide a novel and unique structurally-embedded construction, design, and maintenance data management system that is physically embedded in a construction structure for the life of the construction structure for on-spot data retrievals from and updates to a comprehensive set of construction records, design records, sensor records, and/or maintenance records stored in the novel and unique structurally-embedded construction, design, and maintenance data management system.

Another objective of an embodiment of the present invention is to provide an optional optical media archive in a structurally-embedded construction, design, and maintenance data management system, in addition to an electronic archive that utilizes a non-volatile memory unit or a hard-disk drive to store data, so that construction, design, and maintenance data can be reliably stored in a plurality of optical media (e.g. CD's, DVD's, Blu-ray discs, and etc.) for decades.

Yet another objective of an embodiment of the present invention is to provide an immediate, convenient, and localized access to a coherent electronic and/or optical media archive containing construction, design, and maintenance data at a physical location where renovation, structural upgrade, or maintenance work is to be performed by an authorized personnel.

Furthermore, another objective of an embodiment of the present invention is to provide a method of operating a structurally-embedded construction, design, and maintenance data management system. Yet another objective of an embodiment of the invention is to provide an automatic archiving of construction structure-related sensor records originating from various sensors operatively connected to a structurally-embedded construction, design, and maintenance data management system for subsequent inspections by an authorized personnel.

FIG. 1 shows a structurally-embedded construction, design, and maintenance record data management system (100) embedded in a sidewall (101) of a building, in accordance with an embodiment of the invention. In a preferred embodiment of the invention, the structurally-embedded construction, design, and maintenance record data management system (100) is embedded into an indented slot on the sidewall (101), so that the outer frame (103) of the structurally-embedded construction, design, and maintenance record data management system (100) and user-accessible components (e.g. 105, 107, 109, 111, 113) do not protrude from the sidewall (101) of the building. The sidewall (101) may be an interior sidewall or an exterior sidewall. In another embodiment of the invention, the structurally-embedded construction, design, and maintenance record data management system (100) is bolted onto or attached to a flat surface of the sidewall (101) instead of a dedicated indented slot, even if the outer frame (103) and the user-accessible components (e.g. 105, 107, 109, 111, 113) protrude from the sidewall (101).

Furthermore, in a preferred embodiment of the invention, the user-accessible components in the structurally-embedded construction, design, and maintenance record data management system (100) comprise a peripheral device and external communication input/output (I/O) interface unit (109), a user input interface unit (111), and a panel door with a lockbox (105). In the preferred embodiment of the invention, the peripheral device and external communication input/output (I/O) interface unit (109) is capable of transferring one or more construction, design, and maintenance records from or to an electronic archive in the structurally-embedded construction, design, and maintenance record data management system (100) upon a data transfer request by an authorized personnel's mobile communication device.

In one embodiment of the invention, at least one CPU and at least one memory unit that coordinate data transfers, retrievals, updates, and user authorizations are physically part of the components embedded in the sidewall (101). In this embodiment of the invention, a record management program is executed entirely or nearly entirely by the components that are physically embedded in the sidewall (101), even when an operative connection to the authorized personnel's mobile communication device is not established. In another embodiment of the invention, any capabilities associated with a CPU and a memory unit for the structurally-embedded construction, design, and maintenance record data management system (100) are provided by the authorized personnel's mobile communication device that operates a record management program, when the authorized personnel's mobile communication device is operatively connected to the components embedded in the sidewall (101).

Continuing with FIG. 1, the peripheral device and external communication input/output (I/O) interface unit (109) may contain one or more USB ports, Bluetooth transceivers, Ethernet ports, and/or any other suitable data communication ports that accommodate wired or wireless data communication between the components embedded in the sidewall (101) and external components operatively connected via the peripheral device and external communication input/output (I/O) interface unit (109). In some embodiments of the invention, the components embedded in the sidewall (101) and the external components operatively connected via the peripheral device and external communication input/output (I/O) interface unit (109) form a complete structurally-embedded construction, design, and maintenance record data management system (100), only when they are connected together for data communication. In other embodiments of the invention, the components embedded in the sidewall (101) contain most, if not all, system blocks that constitute the structurally-embedded construction, design, and maintenance record data management system (100).

Figure 8:
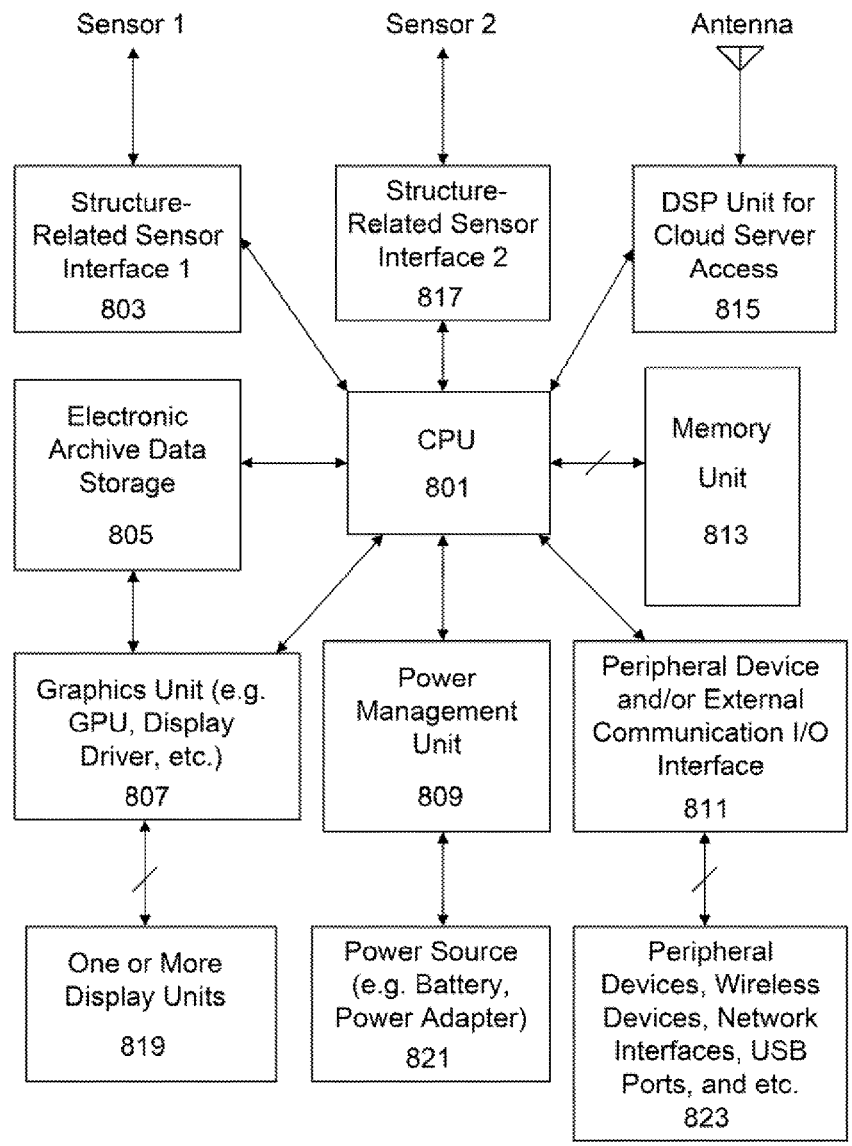
FIG. 8 shows an example of a system diagram of a structurally-embedded construction, design, and maintenance data management system, in accordance with an embodiment of the invention.

Examples of components typically embedded in the sidewall (101) include, but are not limited to, an electronic archive data storage (e.g. 805 of FIG. 8) that may be a non-volatile memory unit or a hard disk drive, and one or more peripheral device and external communication I/O interface units (e.g. 811 of FIG. 8). In some embodiments of the invention, the components embedded in the sidewall (101) will also include the rest of the construction, design, and maintenance record data management system, such as a CPU (e.g. 801 of FIG. 8), a memory unit (e.g. 813 of FIG. 8), a graphics unit (e.g. 807 of FIG. 8), a power management unit (e.g. 809 of FIG. 8), a power source (e.g. 821 of FIG. 8), and/or a display unit (e.g. 819 of FIG. 8). Furthermore, the components embedded in the sidewall (101) can also include one or more structure-related sensor interface units (e.g. 803, 817 of FIG. 8) and a digital signal processing (DSP) unit for cloud server access (e.g. 815 of FIG. 8).

Continuing with FIG. 1, a user input interface unit (111) may comprise a physical keypad, a physical keyboard, or a touch screen that enable an authorized personnel to enter a password for data access authorization and authentication in the structurally-embedded construction, design, and maintenance record data management system (100). Furthermore, the user input interface unit (111) may also be utilized to enable the authorized personnel to choose and navigate desirable menu selections displayed by a display panel (107) and operated by a record management program for data retrieval, upload, update, and/or other functions provided by the structurally-embedded construction, design, and maintenance record data management system (100).

Furthermore, in one embodiment of the invention, an integrated optical media file cabinet (113) may also be part of the structurally-embedded construction, design, and maintenance record data management system (100). Although an electronic archive is provided by an electronic archive data storage (e.g. 805 of FIG. 8), which is typically a non-volatile memory unit (e.g. a Flash memory unit) or a hard disk drive unit, at least some construction, design, and maintenance record data may be stored in one or more CD's, DVD's, or Blu-ray discs when the construction, design, and maintenance record data are first brought to the physical location of a construction structure. Because uploading all contents of an optical medium to the electronic archive data storage every time the optical medium is brought to the structurally-embedded construction, design, and maintenance record data management system (100) is time consuming and inconvenient for an authorized personnel, providing a novel and unique integrated optical media file cabinet (113) in some embodiments of the invention to enable the authorized personnel to "drop off" the optical medium into the integrated optical media file cabinet is a great configuration to keep all construction, design, and maintenance records on-site, along with data stored in the electronic archive data storage. Furthermore, in some instances, storing data in an optical medium may prolong the longevity of recorded data to several decades or even more, compared to data stored in non-volatile memory units and/or hard disk drives. This is especially true in case of CD-R and DVD-R (i.e. non-rewritable) formats that create microscopic physical indentations on the surface of a disc to store data. Most data stored in CD-R or DVD-R formats on an optically-readable disc are expected to provide reliable data retrieval for numerous decades and even centuries.

Continuing with FIG. 1, the structurally-embedded construction, design, and maintenance record data management system (100) also has a panel door with a lockbox (105) to minimize weather and age-related wear and tear in the system components. In a preferred embodiment of the invention, the panel door with the lock box (105) may be waterproof, humidity-proof, and/or dust-proof for long-term reliability and preservation of electronic components and data contained inside the outer frame (103) of the structurally-embedded construction, design, and maintenance record data management system (100). Moreover, the lockbox provides a first-line protection against system break-in's and tempering by unauthorized individuals, while providing an authorized personnel a first-line authorization method to open the panel door to access the user-accessible components (e.g. 105, 107, 109, 111, 113), if the authorized personnel has a correct physical key or a correct combination passcode. In addition, in some embodiments of the invention, electronic password authentication provided by the user input interface unit (111) provides a second-line protection against system break-in's and tempering by unauthorized individuals.

Figure 2:
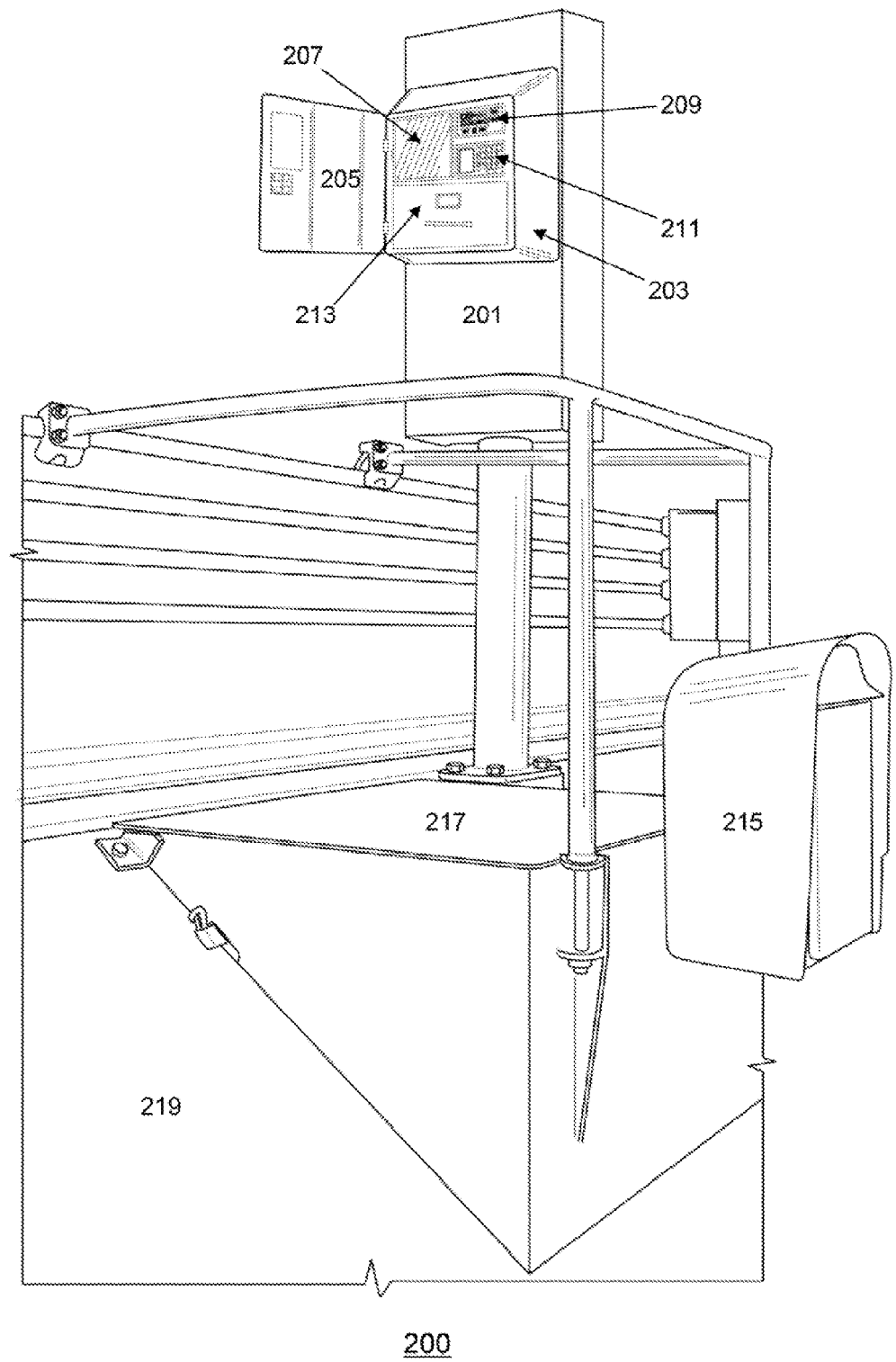
FIG. 2 shows a construction, design, and maintenance record data management system embedded in a side fence of a construction structure, in accordance with an embodiment of the invention.

FIG. 2 shows a perspective view (200) of a structurally-embedded construction, design, and maintenance record data management system (201), which is embedded on a side fence platform (217) of a construction structure (219), in accordance with an embodiment of the invention. In a preferred embodiment of the invention, the structurally-embedded construction, design, and maintenance record data management system (201) is embedded on a side fence platform (217) of the construction structure (219), such as a building, a roadwork, a bridge, and/or a monument. The side fence platform (217) may be located outside or inside of a building, a roadwork, a bridge, and/or a monument. Furthermore, the side fence platform (217) may also integrate a cellular or another wireless data transceiver unit (215) for wireless data access, upload, and update with a cloud server remotely located from the physical location of the construction structure (219). The construction, design, and maintenance record data management system (201) can be bolted onto or attached to a surface of the side fence platform (217).

Furthermore, in a preferred embodiment of the invention, the user-accessible components in the structurally-embedded construction, design, and maintenance record data management system (201) comprises a peripheral device and external communication input/output (I/O) interface unit (209), a user input interface unit (211), and a panel door with a lockbox (205). In the preferred embodiment of the invention, the peripheral device and external communication input/output (I/O) interface unit (209) is capable of transferring one or more construction, design, and maintenance records from or to an electronic archive in the structurally-embedded construction, design, and maintenance record data management system (201) upon a data transfer request by an authorized personnel's mobile communication device.

In one embodiment of the invention, at least one CPU and at least one memory unit that coordinate data transfers, retrievals, updates, and user authorizations are physically part of the components embedded on the side fence platform (217). In this embodiment of the invention, a record management program is executed entirely or nearly entirely by the components that are physically embedded on the side fence platform (217), even when an operative connection to the authorized personnel's mobile communication device is not established. In another embodiment of the invention, any capabilities associated with a CPU and a memory unit for the structurally-embedded construction, design, and maintenance record data management system (201) are provided by the authorized personnel's mobile communication device that operates a record management program, when the authorized personnel's mobile communication device is operatively connected to the components embedded on the side fence platform (217).

Continuing with FIG. 2, the peripheral device and external communication input/output (I/O) interface unit (209) may contain one or more USB ports, Bluetooth transceivers, Ethernet ports, and/or any other suitable data communication ports that accommodate wired or wireless data communication between the components embedded on the side fence platform (217) and external components operatively connected via the peripheral device and external communication input/output (I/O) interface unit (209). In some embodiments of the invention, the components embedded on the side fence platform (217) and the external components operatively connected via the peripheral device and external communication input/output (I/O) interface unit (209) form a complete structurally-embedded construction, design, and maintenance record data management system (201), only when they are connected together for data communication. In other embodiments of the invention, the components embedded on the side fence platform (217) contain most, if not all, system blocks that constitute the structurally-embedded construction, design, and maintenance record data management system (201).

Examples of components typically embedded on the side fence platform (217) include, but are not limited to, an electronic archive data storage (e.g. 805 of FIG. 8) that may be a non-volatile memory unit or a hard disk drive, and one or more peripheral device and external communication I/O interface units (e.g. 811 of FIG. 8). In some embodiments of the invention, the components embedded on the side fence platform (217) will also include the rest of the construction, design, and maintenance record data management system, such as a CPU (e.g. 801 of FIG. 8), a memory unit (e.g. 813 of FIG. 8), a graphics unit (e.g. 807 of FIG. 8), a power management unit (e.g. 809 of FIG. 8), a power source (e.g. 821 of FIG. 8), and/or a display unit (e.g. 819 of FIG. 8). Furthermore, the components embedded on the side fence platform (217) can also include one or more structure-related sensor interface units (e.g. 803, 817 of FIG. 8) and a digital signal processing (DSP) unit for cloud server access (e.g. 815 of FIG. 8).

Continuing with FIG. 2, a user input interface unit (211) may comprise a physical keypad, a physical keyboard, or a touch screen that enable an authorized personnel to enter a password for data access authorization and authentication in the structurally-embedded construction, design, and maintenance record data management system (201). Furthermore, the user input interface unit (211) may also be utilized to enable the authorized personnel to choose and navigate desirable menu selections displayed by a display panel (207) and operated by a record management program for data retrieval, upload, update, and/or other functions provided by the structurally-embedded construction, design, and maintenance record data management system (201).

Furthermore, in one embodiment of the invention, an integrated optical media file cabinet (213) may also be contained within an outer frame (203) of the structurally-embedded construction, design, and maintenance record data management system (201). Although an electronic archive is provided by an electronic archive data storage (e.g. 805 of FIG. 8), which is typically a non-volatile memory unit (e.g. a Flash memory unit) or a hard disk drive unit, at least some construction, design, and maintenance record data may be stored in one or more CD's, DVD's, or Blu-ray discs when the construction, design, and maintenance record data are first brought to the physical location of a construction structure. Because uploading all contents of an optical medium to the electronic archive data storage every time the optical medium is brought to the structurally-embedded construction, design, and maintenance record data management system (201) is time consuming and inconvenient for an authorized personnel, providing a novel and unique integrated optical media file cabinet (213) in some embodiments of the invention to enable the authorized personnel to "drop off" the optical medium into the integrated optical media file cabinet is a great configuration to keep all construction, design, and maintenance records on-site, along with data stored in the electronic archive data storage. Furthermore, in some instances, storing data in an optical medium may prolong the longevity of recorded data to several decades or even more, compared to data stored in non-volatile memory units and/or hard disk drives. This is especially true in case of CD-R and DVD-R (i.e. non-rewritable) formats that create microscopic physical indentations on the surface of a disc to store data. Most data stored in CD-R or DVD-R formats on an optically-readable disc are expected to provide reliable data retrieval for numerous decades and even centuries.

Continuing with FIG. 2, the structurally-embedded construction, design, and maintenance record data management system (201) also preferably has a panel door with a lockbox (205) to minimize weather and age-related wear and tear in the system components. Moreover, the lockbox provides a first-line protection against system break-in's and tempering by unauthorized individuals, while providing an authorized personnel a first-line authorization method to open the panel door to access the user-accessible components (e.g. 205, 207, 209, 211, 213), if the authorized personnel has a correct physical key or a correct combination passcode. In addition, in some embodiments of the invention, electronic password authentication provided by the user input interface unit (211) provides a second-line protection against system break-in's and tempering by unauthorized individuals.

Figure 3:
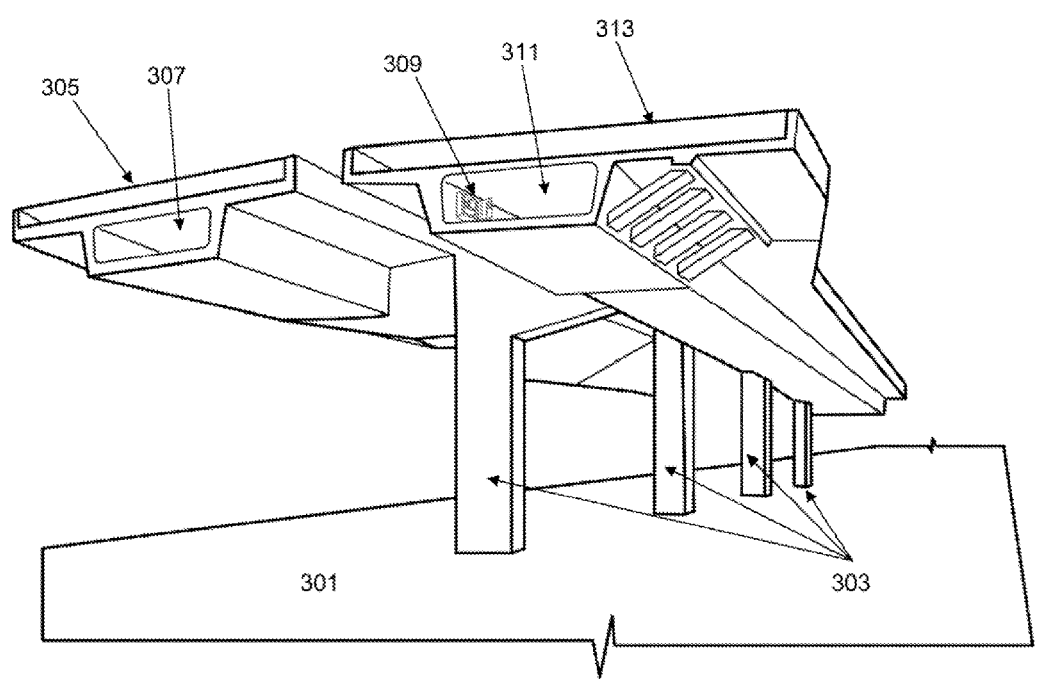
FIG. 3 shows a construction, design, and maintenance record data management system embedded in a bridge maintenance tunnel, in accordance with an embodiment of the invention.

FIG. 3 shows a perspective view of a structurally-embedded construction, design, and maintenance record data management system (309) that is embedded in a first bridge maintenance tunnel (311) of a bridge (300), in accordance with an embodiment of the invention. In a preferred embodiment of the invention, a bridge maintenance tunnel (e.g. 311, 307) is typically located underneath a corresponding upper plate (e.g. 313, 305) of a bridge (e.g. 300), and the structurally-embedded construction, design, and maintenance record data management system (e.g. 309) can be embedded inside the bridge maintenance tunnel (e.g. 311) by being incorporated or attached to a sidewall of the bridge maintenance tunnel (e.g. 311), as shown in FIG. 3. In the particular example of FIG. 3, bridge supports (303) provide ground support (301) for maintenance tunnels and upper plates. In another example, a bridge may be a suspension bridge with fewer bridge supports.

In one embodiment of the invention, the structurally-embedded construction, design, and maintenance record data management system (309) is located in only one of the two bridge maintenance tunnels (i.e. 311), because a single system can provide a comprehensive set of records for all aspects of the bridge (300). In another embodiment of the invention, the structurally-embedded construction, design, and maintenance record data management system (309) is located in each bridge maintenance tunnel. Examples of data stored in an electronic archive and an optional optical media archive of the structurally-embedded construction, design, and maintenance record data management system (309) include, but are not limited to, construction records from the initial construction period of the bridge (300), design records from the initial design period of the bridge (300), maintenance and improvement records since the initial design and the initial construction period of the bridge (300), and any sensor records associated with the bridge (300).

The concept of embedding a construction, design, and maintenance record data management system (309) inside a bridge maintenance tunnel or another construction structure is unique and novel. Conventional construction structures today do not incorporate an electronic system that contains a comprehensive set of an on-site electronic archive of construction, design, and maintenance records for immediate access and review by an authorized personnel performing renovation or maintenance work on-site. By providing a unique and novel construction, design, and maintenance record data management system, which is structurally embedded in a sidewall, a fence, a bridge maintenance tunnel, or a bridge maintenance catwalk, various embodiments of the present invention enable highly-efficient and speedy diagnosis and review of existing construction structures, while reducing the social cost of structural renovation, structural upgrade, and maintenance associated with the existing construction structures for governments, corporations, and citizens.

Figure 4:
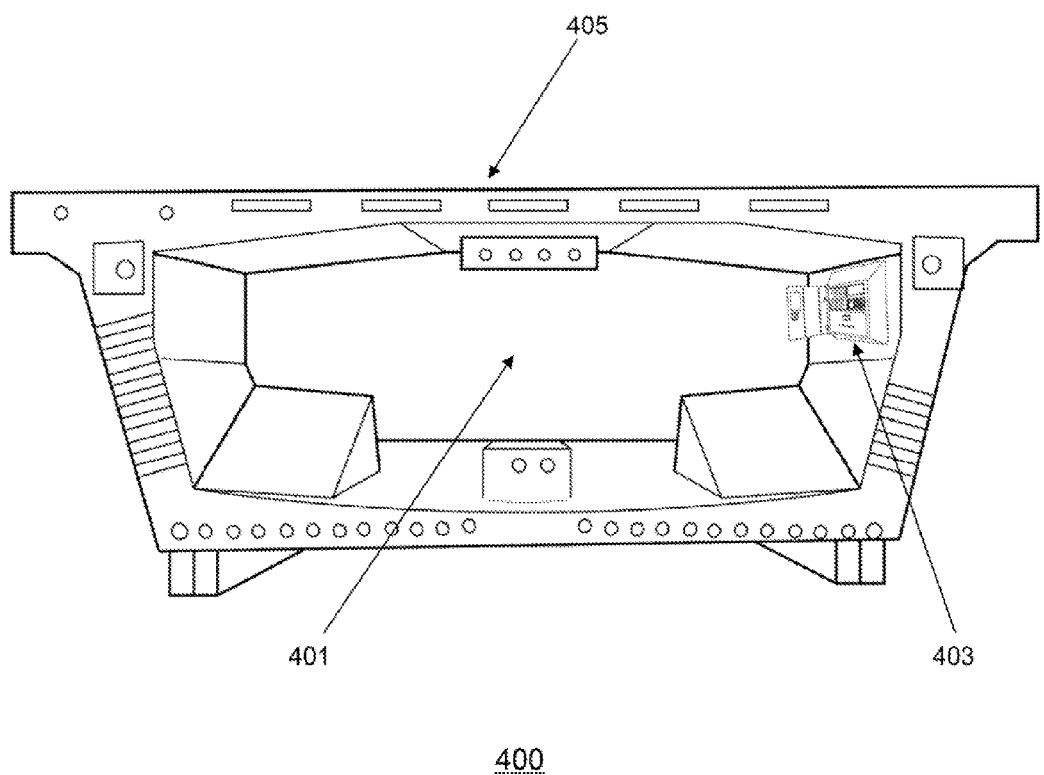
FIG. 4 shows a detailed view of a construction, design, and maintenance record data management system embedded in a bridge maintenance tunnel, in accordance with an embodiment of the invention.

FIG. 4 shows a detailed view (400) of a construction, design, and maintenance record data management system (403) embedded in a bridge maintenance tunnel (401), in accordance with an embodiment of the invention. In a preferred embodiment of the invention, the bridge maintenance tunnel (401) is typically located underneath a corresponding upper portion (405) of a bridge, and the structurally-embedded construction, design, and maintenance record data management system (403) can be embedded inside the bridge maintenance tunnel (401) by being incorporated or attached to a sidewall of the bridge maintenance tunnel (401), as shown in FIG. 4.

In one embodiment of the invention, the structurally-embedded construction, design, and maintenance record data management system (403) is located in only one of one or more bridge maintenance tunnels, because a single system can provide a comprehensive set of records for all aspects of the bridge. In another embodiment of the invention, the structurally-embedded construction, design, and maintenance record data management system (403) is located in each bridge maintenance tunnel. Examples of data stored in an electronic archive and an optional optical media archive of the structurally-embedded construction, design, and maintenance record data management system (403) include, but are not limited to, construction records from the initial construction period of the bridge, design records from the initial design period of the bridge, maintenance and improvement records since the initial design and the initial construction period of the bridge, and any sensor records associated with the bridge.

Figure 5:
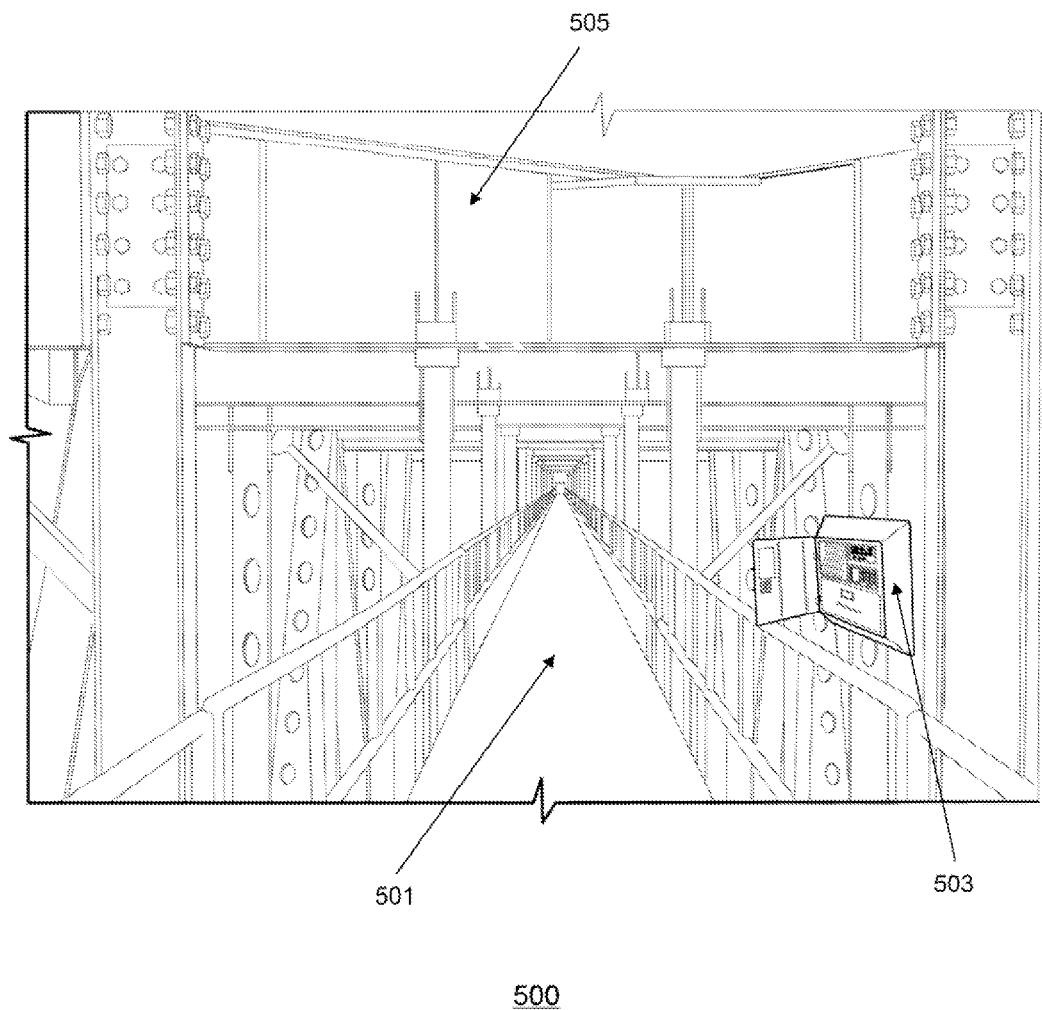
FIG. 5 shows a construction, design, and maintenance record data management system embedded in a bridge maintenance catwalk, in accordance with an embodiment of the invention.

FIG. 5 shows a perspective view (500) of a construction, design, and maintenance record data management system (503) embedded in a bridge maintenance catwalk (501), in accordance with an embodiment of the invention. In a preferred embodiment of the invention, a bridge maintenance catwalk (501) is typically located underneath a corresponding upper portion (505) of a bridge, and the structurally-embedded construction, design, and maintenance record data management system (503) can be embedded inside the bridge maintenance catwalk (501) by being incorporated or attached to a sidewall of the bridge maintenance catwalk (501), as shown in FIG. 5. Some bridges may have maintenance tunnels as previously shown in FIGS. 3-4, while other bridges may have bridge maintenance catwalks as shown in FIG. 5.

In one embodiment of the invention, only a single structurally-embedded construction, design, and maintenance record data management system (503) may be necessary for an entire bridge regardless of the number of bridge maintenance catwalks (501) in the entire bridge, because a single system can provide a comprehensive set of records for all aspects of the bridge. In another embodiment of the invention, the structurally-embedded construction, design, and maintenance record data management system (503) can be incorporated in each bridge maintenance catwalk for additional convenience of access. Examples of data stored in an electronic archive and an optional optical media archive of the structurally-embedded construction, design, and maintenance record data management system (503) include, but are not limited to, construction records from the initial construction period of the bridge, design records from the initial design period of the bridge, maintenance and improvement records since the initial design and the initial construction period of the bridge, and any sensor records associated with the bridge.

The concept of embedding a construction, design, and maintenance record data management system (503) inside a bridge maintenance catwalk or another construction structure is unique and novel. Conventional construction structures today do not incorporate an electronic system that contains a comprehensive set of an on-site electronic archive of construction, design, and maintenance records for immediate access and review by an authorized personnel performing renovation or maintenance work on-site. By providing a unique and novel construction, design, and maintenance record data management system, which is structurally embedded in a sidewall, a fence, a bridge maintenance tunnel, or a bridge maintenance catwalk, various embodiments of the present invention enable highly-efficient and speedy diagnosis and review of existing construction structures, while reducing the social cost of structural renovation, structural upgrade, and maintenance associated with the existing construction structures for governments, corporations, and citizens.

Figure 6:
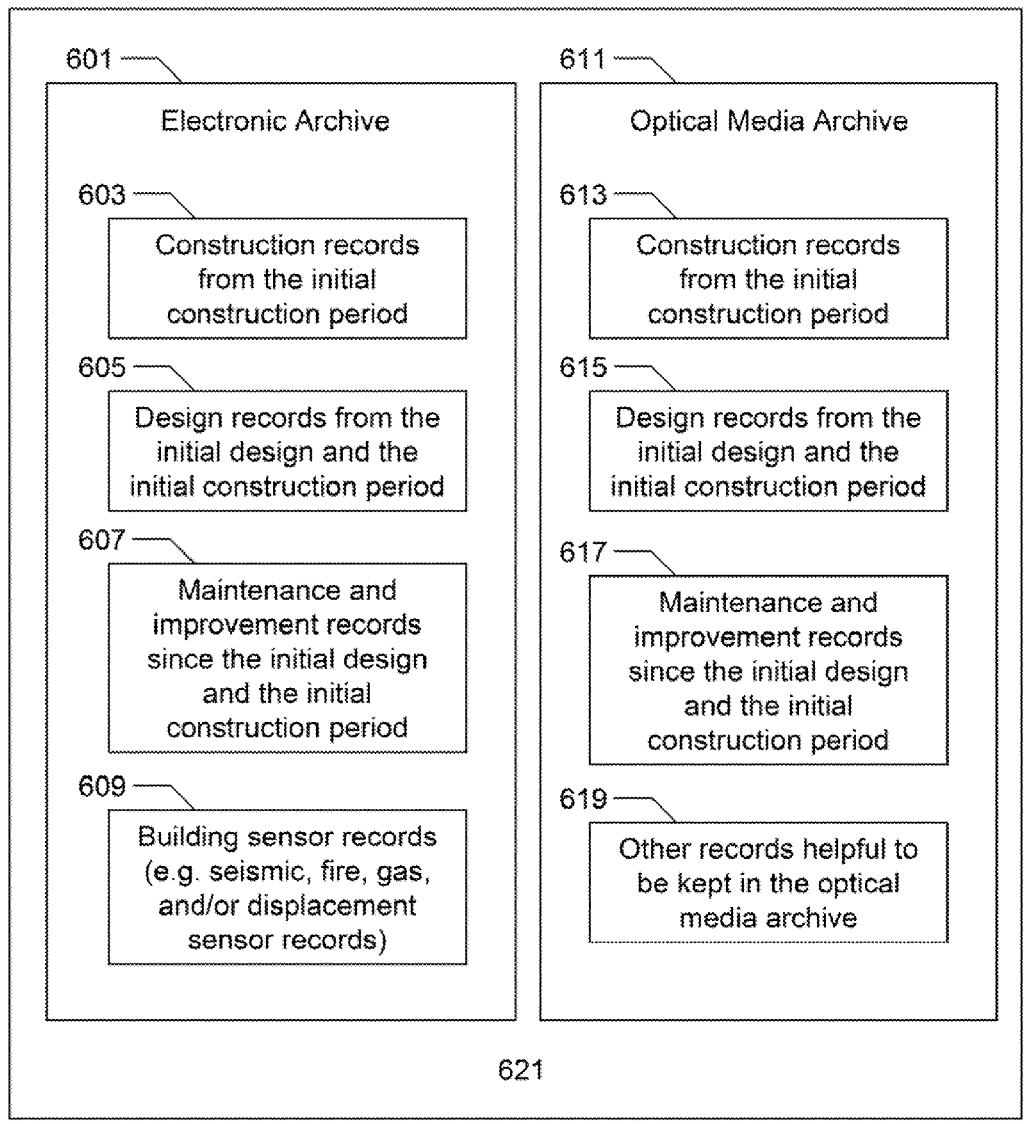
FIG. 6 shows an example of data organization for a structurally-embedded construction, design, and maintenance record data management system, in accordance with an embodiment of the invention.

FIG. 6 shows an example (600) of data organization (621) for a structurally-embedded construction, design, and maintenance record data management system, in accordance with an embodiment of the invention. In a preferred embodiment of the invention, the structurally-embedded construction, design, and maintenance record data management system includes an electronic archive (601) implemented on an electronic archive data storage (e.g. 805 of FIG. 8), wherein the electronic archive (601) comprises construction records (603) from an initial construction period, design records (605) from the initial design period and the initial construction period, maintenance and improvement records (607) after the initial design period and the initial construction period, and building sensor records (609) collected from seismic, smoke, fire, gas, and/or displacement sensor records.

In one embodiment of the invention, the electronic archive (601) is hosted and managed in an electronic archive data storage (e.g. 805) with a record management program executed on a CPU and a memory unit, which is capable of receiving and categorizing various electronic records for construction, design, and maintenance-related activities. In one example, the electronic archive data storage may be a non-volatile memory unit, such as a Flash memory unit. In another example, the electronic archive data storage may be a hard-disk drive.

Continuing with FIG. 6, in one embodiment of the invention, an optical media archive (611) can also store various records related to construction, design, and maintenance of a construction structure. For example, as shown in FIG. 6, an optical media archive (611) is contained in an optical media file cabinet, which is integrated as a physical cabinet unit with the rest of the structurally-embedded construction, design, and maintenance record data management system, as previously shown in FIG. 1 and FIG. 2. In one embodiment of the invention, the optical media archive (611) includes one or more CD's, DVD's, Blu-ray discs, or another optically-readable media that contain construction records (613) from an initial construction period, design records (615) from the initial design period and the initial construction period, maintenance and improvement records (617) after the initial design period and the initial construction period, and any other records (619) that are helpful to be stored in the optical media archive (611).

Figure 7:
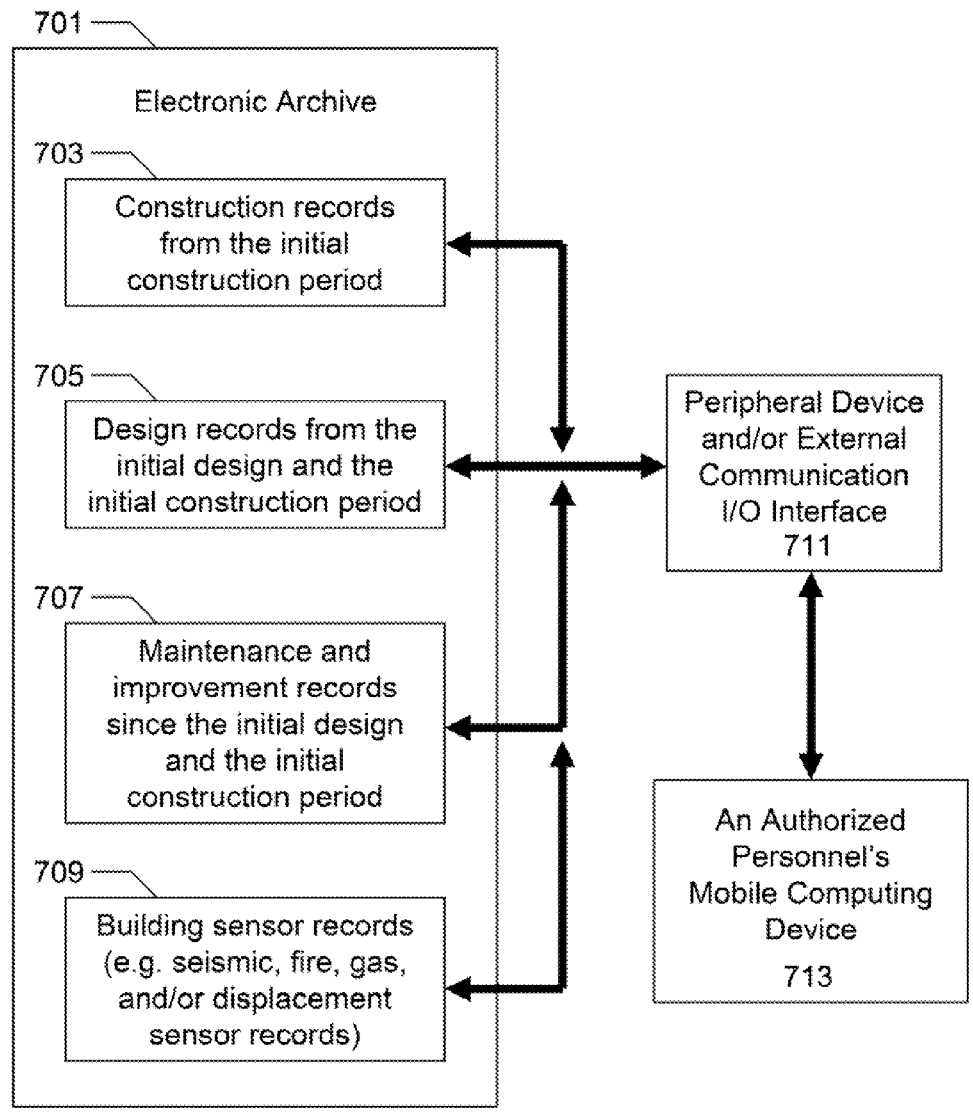
FIG. 7 shows an embodiment of a system connection diagram for data communication between an authorized personnel's mobile computing device and an electronic archive portion of a structurally-embedded construction, design, and maintenance data management system, in accordance with an embodiment of the invention.

FIG. 7 shows an embodiment of a system connection diagram (700) for data communication between an authorized personnel's mobile computing device (713) and an electronic archive portion (701) of a structurally-embedded construction, design, and maintenance data management system, in accordance with an embodiment of the invention. In one embodiment of the invention, the electronic archive portion (701) comprises construction records (703) from an initial construction period, design records (705) from the initial design period and the initial construction period, maintenance and improvement records (707) after the initial design period and the initial construction period, and building sensor records (709) collected from seismic, smoke, fire, gas, and/or displacement sensor records.

In the embodiment of the invention as shown in FIG. 7, the electronic archive portion (701) is implemented on a non-volatile memory unit, a hard disk drive, or another electronic data storage device with a record management program executed on a CPU and a memory unit, which is capable of receiving and categorizing various electronic records for construction, design, and maintenance-related activities. In one embodiment of the invention, the CPU and the memory unit are physically embedded in a construction structure along with the electronic archive portion (701). In another embodiment of the invention, the CPU and the memory unit for executing the record management program is detachably provided by a CPU and a memory unit in the authorized personnel's mobile computing device (713), when an operative connection is established for data communication between the electronic archive portion (701) and the authorized personnel's mobile computing device (713) via a peripheral device and/or external communication I/O interface unit (711), as shown in FIG. 7.

Continuing with FIG. 7, in one embodiment of the invention, the authorized personnel's mobile computing device is a notebook computer, a smart phone, or another generic computing device configured to connect to the electronic archive portion (701) of the structurally-embedded construction, design, and maintenance data management system for data communication. In another embodiment of the invention, the authorized personnel's computing device is a dedicated device specifically designed to operate with the structurally-embedded construction, design, and maintenance data management system for data communication.

FIG. 8 shows an example of a system diagram of a structurally-embedded construction, design, and maintenance data management system (800), in accordance with an embodiment of the invention. In a preferred embodiment of the invention, the structurally-embedded construction, design, and maintenance data management system (800) has a CPU (801) which is operatively connected to a memory unit (813), one or more structure-related sensor interface units (803, 817), electronic archive data storage (805), a graphics unit (807) (e.g. a graphics processor, a display driver, and etc.), a power management unit (809), a peripheral device and/or external communication I/O interface unit (811), and a digital signal processing (DSP) unit for cloud server access (815).

In one embodiment of the invention, these logical units may be placed in a single enclosure unit as a structurally-embedded construction, design, and maintenance data management system (800). In another embodiment of the invention, only a few of the logical units from the overall system (800), such as the electronic archive data storage (805) and the peripheral device and/or external communication I/O interface unit (811), may be placed in an enclosure (e.g. 103 of FIG. 1) as a structurally-embedded unit in a construction structure, while the rest of the logical units, such as the CPU (801) and the memory unit (813), are detachably and portably provided by an authorized personnel's mobile computing device upon operative connection to the enclosure that is structurally-embedded equipment in the construction structure.

In the preferred embodiment of the invention, the CPU (801) is configured to control each logical unit operatively (i.e. directly or indirectly) connected to the CPU (801). The memory unit (813) typically comprises volatile memory banks based on DRAM's. In some embodiments of the invention, the memory unit (813) may use non-volatile memory technologies such as SRAM's and/or Flash memory. The memory unit (813) is capable of storing programs and applications which can be executed by the CPU (801), the graphics unit (807), or another logical unit operatively connected to the memory unit (813). In particular, in the preferred embodiment of the invention, a record management program and/or other software executed on the CPU (801) and the memory unit (813) of the system (800) are capable of receiving and categorizing a construction record, a design record, and a maintenance and improvement record. Furthermore, the record management program and/or other software can also detect, manage, and store sensor records from seismic sensors, smoke detectors, gas leak sensors, displacement sensors, and/or any other sensors external or internal to the construction structure.

Furthermore, in one embodiment of the invention, the electronic archive data storage (805) is configured to store construction records from an initial construction period, design records from the initial design and the initial construction period, maintenance and improvement records since the initial design and the initial construction period, and any other relevant data received or processed by the system (800). In some embodiments of the invention, the electronic archive data storage (805) may also store sensor records from seismic, fire, gas leak, smoke detection, displacement, and any other relevant sensors that may be internal or external to the construction structure where the system (800) is embedded into.

Continuing with FIG. 8, in some embodiments of the invention, one or more structure-related sensor interface units (803, 817) are operatively connected to seismic, fire, gas leak, smoke detection, displacement, and any other relevant sensors (e.g. "Sensor 1," and "Sensor 2" as shown in FIG. 8), which may be internal or external to the construction structure. Preferably, these sensor interface units (803, 817) are configured to receive and record sensory event-related data from one or more sensors operatively connected to the sensor interface units (803, 817). Furthermore, as an optional feature in some embodiments of the invention, the digital signal processing (DSP) unit for cloud server access (815) is present in the system (800) and is operatively connected to an radio frequency (RF) antenna. The DSP unit for cloud server access (815) is generally configured to receive and transmit digitized data signals wirelessly between the portions of the system (800) embedded in the construction structure and a remotely-located and authorized computer server.

In addition, in one embodiment of the invention, the power management unit (809) is present in the structurally-embedded portion of the system (800), and is operatively connected to a power supply unit and a power source (e.g. battery, power adapter) (821). The power management unit (809) generally controls power supplied to the structurally-embedded portion of the system (800) and its logical units. Moreover, the peripheral device and/or external communication I/O interface unit (811), as shown in FIG. 8, can be operatively connected to one or more peripheral devices, wireless devices, USB ports, and other external data communication media (823) that enable data communication between the structurally-embedded portion of the system (800) and the authorized personnel's mobile computing device.

Continuing with FIG. 8, in one embodiment of the invention, the graphics unit (807) in the system (800) comprises a graphics processor, a display driver, a dedicated graphics memory unit, and/or another graphics-related logical components. In general, the graphics unit (807) is able to process and communicate graphics-related data with the CPU (801), the display driver, and/or the dedicated graphics memory unit. The graphics unit (807) is also operatively connected to one or more display units (819). In addition, the CPU (801) may be operatively connected to the sound unit which contains audio-related logical components for generation or recording of audio data from a microphone operatively connected to the electronic system.

Figure 9:
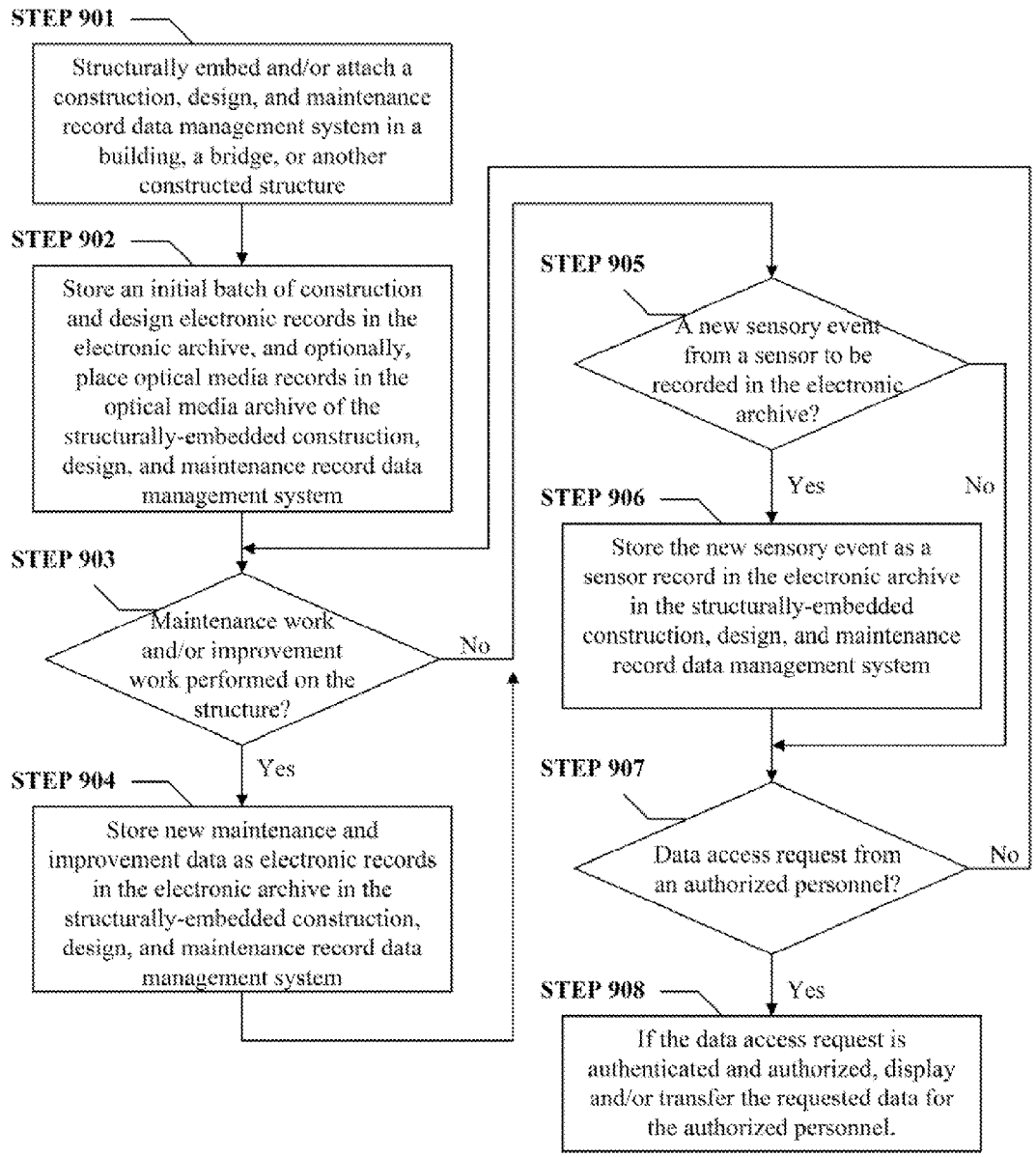
FIG. 9 shows a method of operating a structurally-embedded construction, design, and maintenance data management system, in accordance with an embodiment of the invention.

FIG. 9 shows a method (900) of operating a structurally-embedded construction, design, and maintenance data management system, in accordance with an embodiment of the invention. In a preferred embodiment of the invention, a construction, design, and maintenance data management system is first structurally embedded in a building, a bridge, or another constructed structure, as shown in STEP 901. Then, an initial batch of construction and design electronic records are stored in an electronic archive portion of the construction, design, and maintenance data management system, as shown in STEP 902. Optionally, optical media records can be also placed in an optical media archive section of the construction, design, and maintenance data management system. Preferably, the optical media archive section at least partially comprises an integrated optical media file cabinet (e.g. 113 of FIG. 1).

Then, if maintenance work and/or improvement work is performed on the construction structure, as shown in STEP 903, any new maintenance and improvement data provided by an authorized personnel can be stored as new electronic records in the electronic archive of the construction, design, and maintenance data management system, as shown in STEP 904. Then, as an optional step, the construction, design, and maintenance data management system can also detect any new sensory events from one or more external or internal sensors, as shown in STEP 905. If there are new sensory events to be recorded, then the construction, design, and maintenance data management system can store each new sensory event as a sensor record in the electronic archive in the construction, design, and maintenance data management system, as shown in STEP 906.

Furthermore, when a data access request is made by an authorized personnel to the construction, design, and maintenance data management system, as shown in STEP 907, if the data request is authenticated and authorized, the construction, design, and maintenance data management system can then display and/or transfer the requested data for the authorized personnel, as shown in STEP 908.

As shown in various figures and descriptions above, the concept of embedding a construction, design, and maintenance record data management system inside a building structure, a bridge maintenance tunnel, a bridge maintenance catwalk, or another construction structure is unique and novel. Conventional construction structures today do not incorporate an electronic system that contains a comprehensive set of an on-site electronic archive of construction, design, and maintenance records for immediate access and review by an authorized personnel performing renovation or maintenance work on-site. By providing a unique and novel construction, design, and maintenance record data management system, which is structurally embedded in a sidewall, a fence, a bridge maintenance tunnel, or a bridge maintenance catwalk, various embodiments of the present invention enable highly-efficient and speedy diagnosis and review of existing construction structures, while reducing the social cost of structural renovation, structural upgrade, and maintenance associated with the existing construction structures for governments, corporations, and citizens.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A structurally-embedded construction, design, and maintenance record data management system comprising:
    an electronic archive comprising a construction record from an initial construction period, a design record from an initial design period and the initial construction period, and a maintenance and improvement record after the initial design period and the initial construction period;
    an electronic archive data storage unit hosting the electronic archive with a record management program executed on a CPU and a memory unit for receiving and categorizing the construction record, the design record, and the maintenance and improvement record;
    a peripheral device and external communication input and output interface unit that transfers one or more construction, design, and maintenance records from or to the electronic archive upon a data transfer request by an authorized personnel's mobile communication device;
    a physical file cabinet drawer for an authorized personnel to retrieve or drop off an optical media disc that contains a building's blueprint or maintenance records that are not part of the electronic archive;
    an outer frame incorporating a lockbox and a door panel, wherein the outer frame, the lockbox, and the door panel encapsulate the physical file cabinet drawer, the electronic archive, the electronic archive data storage unit, and the peripheral device and external communication input and output interface unit, and
    a construction structure comprising at least one of a side fence platform, a bridge maintenance tunnel, and a vertical sidewall of a building or a bridge structure, wherein the outer frame, which encapsulates the physical file cabinet drawer, the electronic archive, the electronic archive data storage unit, and the peripheral device and external communication input and output interface unit with the lockbox and the door panel, is physically embedded into the construction structure.

2. The structurally-embedded construction, design, and maintenance record data management system of claim 1, wherein the peripheral device and external communication input and output interface unit utilizes a Universal Serial Bus (USB) standard, a Bluetooth wireless protocol, or another communication protocol to communicate with the authorized personnel's mobile communication device.

3. The structurally-embedded construction, design, and maintenance record data management system of claim 1, further comprising a graphics unit and a display panel operatively connected to the CPU and the memory unit to display a requested content of the electronic archive using the record management program.

4. The structurally-embedded construction, design, and maintenance record data management system of claim 1, further comprising a user input interface unit operatively connected to the CPU and the memory unit executing the record management program to accommodate the authorized personnel's data display or data transfer request.

5. The structurally-embedded construction, design, and maintenance record data management system of claim 1, wherein the electronic archive data storage is a non-volatile memory unit or a hard disk drive.

6. The structurally-embedded construction, design, and maintenance record data management system of claim 1, further comprising a structure-related sensor interface unit that communicates with a seismic sensor, a smoke detector, a gas leak sensor, a displacement sensor, or another sensor incorporated in the construction structure.

7. The structurally-embedded construction, design, and maintenance record data management system of claim 6, wherein the electronic archive further comprises a structural or building sensor record that contains one or more new sensor events from the seismic sensor, the smoke detector, the gas leak sensor, the displacement sensor, or another sensor incorporated in the construction structure.

8. The structurally-embedded construction, design, and maintenance record data management system of claim 1, wherein the construction structure is a building, a bridge, a maintenance catwalk of the bridge, a maintenance tunnel associated with the bridge, or another structure that is artificially constructed or maintained by humans.

9. The structurally-embedded construction, design, and maintenance record data management system of claim 1, further comprising a power management unit operatively connected to a power source to supply electrical power to the CPU, the memory unit, the electronic archive data storage, and the peripheral device and external communication input and output interface unit.

10. The structurally-embedded construction, design, and maintenance record data management system of claim 1, further comprising a digital signal processing (DSP) unit for a wireless access of the one or more construction, design, and maintenance records stored in the electronic archive data storage.

11. A method for providing construction, design, and maintenance record data management from a lockbox device, the method comprising the steps of:
    encapsulating a physical file cabinet drawer, an electronic archive, an electronic archive data storage, and a peripheral device and external communication input and output interface unit in the lockbox device with an outer frame, a lockbox, and a door panel;
    embedding the lockbox device into at least one of a side fence platform, a bridge maintenance tunnel, and a vertical sidewall of a building or a bridge structure;
    unlocking the door panel on the lockbox device with a correct physical key or a correct combination passcode;
    opening the physical file cabinet drawer located within the lockbox device to retrieve or drop off an optical media disc that contains a building's blueprint or maintenance records;
    initiating an operation of a record management program executed by a CPU and a memory unit of the lockbox device;
    storing an initial batch of construction, design, and structure-related electronic records in the electronic archive of the lockbox device using the record management program, wherein the electronic archive is hosted by the electronic archive data storage;

when maintenance work or improvement work is performed on the construction structure, storing new maintenance and improvement data as an updated electronic record in the electronic archive of the lockbox device; and when a data access request from an authorized personnel is received and authorized by the record management program, displaying or transferring requested data for the authorized personnel.

12. The method of claim 11, further comprising a step of checking whether a new sensory event has occurred from a seismic, fire, smoke, gas leak, or displacement sensor operatively connected to the construction structure.

13. The method of claim 12, further comprising a step of storing the new sensory event as a structural or building sensor record in the electronic archive of the lockbox device, when the new sensory event has occurred.

14. The method of claim 11, further comprising a step of placing optical media records in an optical media archive attached to the lockbox device.

15. The method of claim 11, wherein the electronic archive data storage is a non-volatile memory unit or a hard disk drive.

* * * * *